(12) United States Patent
Sekiya

(10) Patent No.: US 6,944,370 B2
(45) Date of Patent: Sep. 13, 2005

(54) METHOD OF PROCESSING A SEMICONDUCTOR WAFER

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 102 days.

(21) Appl. No.: 10/471,401

(22) PCT Filed: Jan. 16, 2003

(86) PCT No.: PCT/JP03/00302

§ 371 (c)(1),
(2), (4) Date: Sep. 10, 2003

(87) PCT Pub. No.: WO03/065430

PCT Pub. Date: Aug. 7, 2003

(65) Prior Publication Data

US 2004/0115903 A1 Jun. 17, 2004

(30) Foreign Application Priority Data

Jan. 28, 2002 (JP) ....................... 2002-018795

(51) Int. Cl.[7] ................................ G02B 6/42
(52) U.S. Cl. ......................... 385/30; 385/129
(58) Field of Search .................. 385/30, 129; 451/66; 257/774; 428/216

(56) References Cited

U.S. PATENT DOCUMENTS

| | | | | |
|---|---|---|---|---|
| 5,850,498 A | * | 12/1998 | Shacklette et al. | 385/129 |
| 5,855,988 A | * | 1/1999 | Matsuo | 428/195.1 |
| 5,900,674 A | * | 5/1999 | Wojnarowski et al. | 257/774 |
| 6,428,399 B1 | * | 8/2002 | Tanabe et al. | 451/66 |
| 6,621,951 B1 | * | 9/2003 | Zhao et al. | 385/30 |
| 2003/0013233 A1 | | 1/2003 | Shibata | |

FOREIGN PATENT DOCUMENTS

| | | |
|---|---|---|
| EP | 1154474 | 3/2001 |
| JP | 200158453 | 3/2001 |
| JP | 2001-60591 | 3/2001 |
| JP | 2001-60658 | 3/2001 |
| JP | 2001-110829 | 4/2001 |
| JP | 2002-270719 | 9/2002 |
| JP | 200331524 | 1/2003 |
| KR | 1080201 | 7/1994 |
| WO | WO 01/15223 | 3/2001 |

* cited by examiner

*Primary Examiner*—John F. Niebling
*Assistant Examiner*—Andre' C. Steven
(74) *Attorney, Agent, or Firm*—Smith, Gambrell & Russell, LLP

(57) ABSTRACT

A method of processing a semiconductor wafer that has circuits in each of a plurality of regions sectioned by a plurality of streets on the front surface and has a coating layer formed on the front surface having the circuits to a predetermined thickness, the method comprising a stress-reducing step of reducing the stress of the coating layer by forming a plurality of grooves in the coating layer formed on the front surface of the semiconductor wafer; and a grinding step of processing the back surface of the semiconductor wafer by grinding to a predetermined thickness after the stress-reducing step.

3 Claims, 4 Drawing Sheets

(a)

(b)

(a)

(b)

(a)

(b)

METHOD OF PROCESSING A SEMICONDUCTOR WAFER

TECHNICAL FIELD

Figure 1:
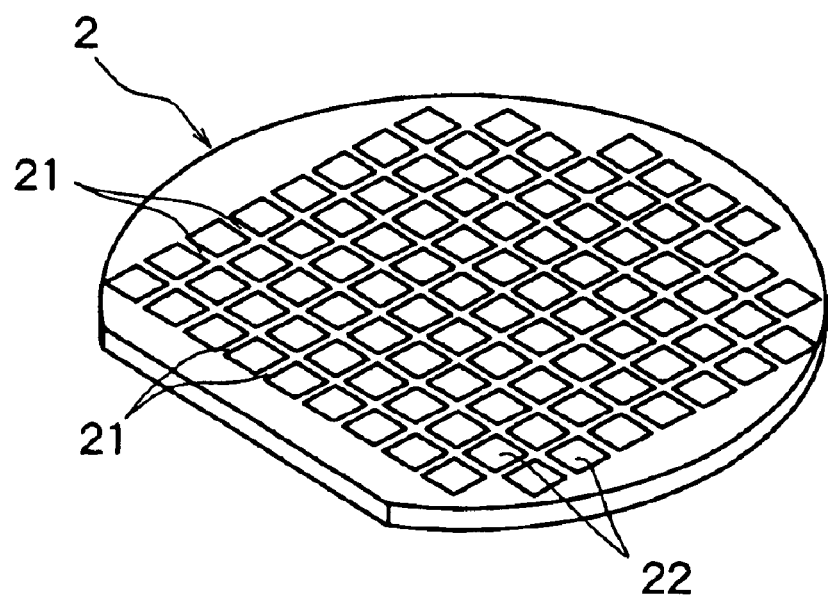
Figure 1:
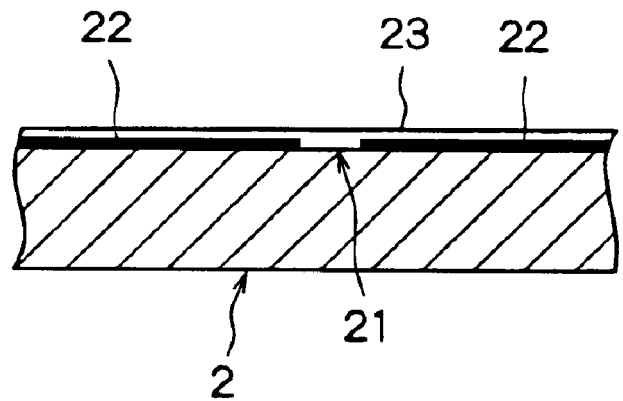

The present invention relates to a method of processing a semiconductor wafer having a large number of circuits on the front surface to a predetermined thickness.

BACKGROUND ART

In the process of semiconductor device production, semiconductor chips are produced by forming a circuit such as IC, LSI or the like in a plurality of regions sectioned by a plurality of streets on the front surface of a substantially disk-like semiconductor wafer and dicing along the streets. In order to improve the heat radiation of the thus manufactured semiconductor chip, it is desired that the semiconductor chip be made as thin as possible. Also, to enable the downsizing of a portable telephone, smart card or personal computer that uses a large number of semiconductor chips, it is desired that the semiconductor chip be made as thin as possible. To this end, before the semiconductor wafer is divided into individual semiconductor chips by dicing, the back surface of the semiconductor wafer is processed to a thickness of about 50 $\mu$m by grinding.

When the back surface of the semiconductor wafer is ground to reduce its thickness, both sides of the semiconductor wafer are warped toward the front surface side. For example, when the back surface of a semiconductor wafer having a diameter of 200 mm is ground to a thickness of 50 $\mu$m, both sides of the semiconductor wafer are warped toward the front surface side by about 60 mm. It has been found that this warping of the semiconductor wafer is caused by a coating layer formed by applying a polyimide resin having excellent heat resistance, electric insulating properties and mechanical strength to the front surface of the semiconductor wafer and baking it in order to protect circuits formed on the front surface of the semiconductor wafer, or another coating layer such as a metal layer, insulating layer or the like. That is, a stress for pulling toward the center direction is generated in the coating layer formed on the front surface of the semiconductor wafer. Therefore, when the back surface of the semiconductor wafer is processed to a thinness of about 50 $\mu$m thick by grinding, the semiconductor wafer is warped as described above because its stiffness does not withstand the above stress. When the semiconductor wafer is thus warped, it is difficult to smoothly carry out dicing which is a subsequent step.

It is a principal technical subject of the present invention that has been made in view of the above fact to provide a method of processing a semiconductor wafer, which can inhibit the semiconductor wafer from being warped even when its back surface is ground to be processed thin.

DISCLOSURE OF THE INVENTION

To attain the above principal technical subject of the present invention, according to the present invention, there is provided a method of processing a semiconductor wafer that has circuits in a plurality of regions sectioned by a plurality of streets on the front surface and has a coating layer formed on the front surface having the circuits to a predetermined thickness, the method comprising:

a stress-reducing step of reducing the stress of the coating layer by forming a plurality of grooves in the coating layer formed on the front surface of the semiconductor wafer; and a grinding step of processing the back surface of the semiconductor wafer by grinding to a predetermined thickness after the stress-reducing step.

The plural grooves to be formed in the coating layer in the above stress-reducing step are formed along a plurality of streets.

The plural grooves to be formed in the coating layer in the above stress-reducing step are formed by cutting by moving the semiconductor wafer relatively to the cutting blade while the cutting blade is rotated.

BRIEF DESCRIPTION OF THE INVENTION

Figure 2:
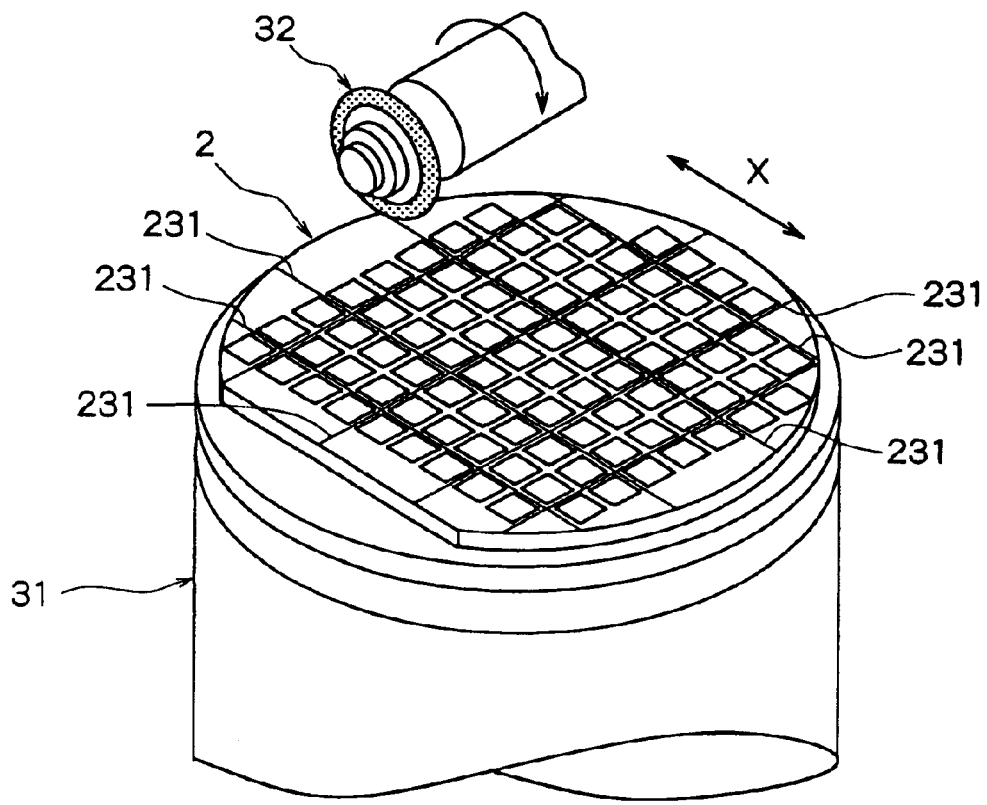
Figure 2:
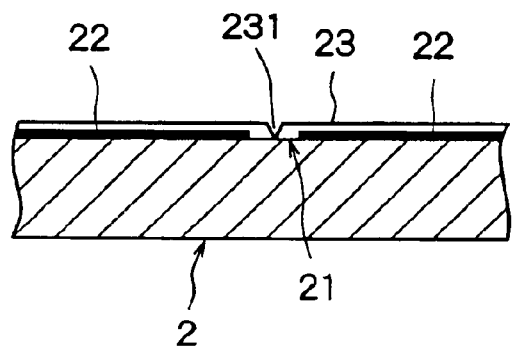
Figure 3:
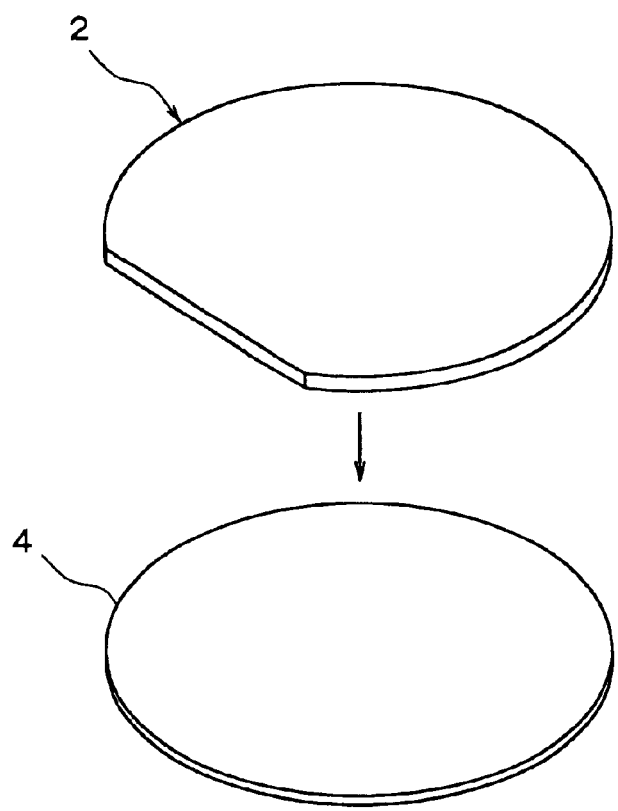
Figure 3:
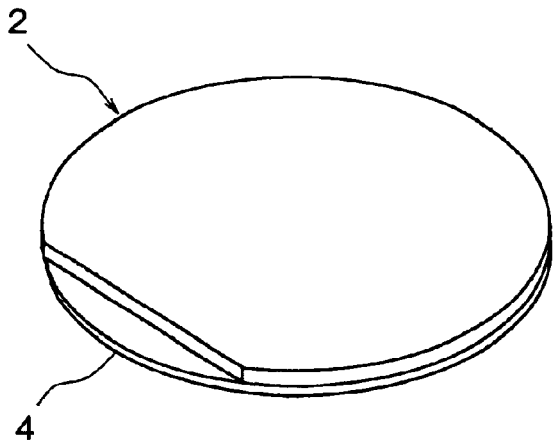
Figure 4:
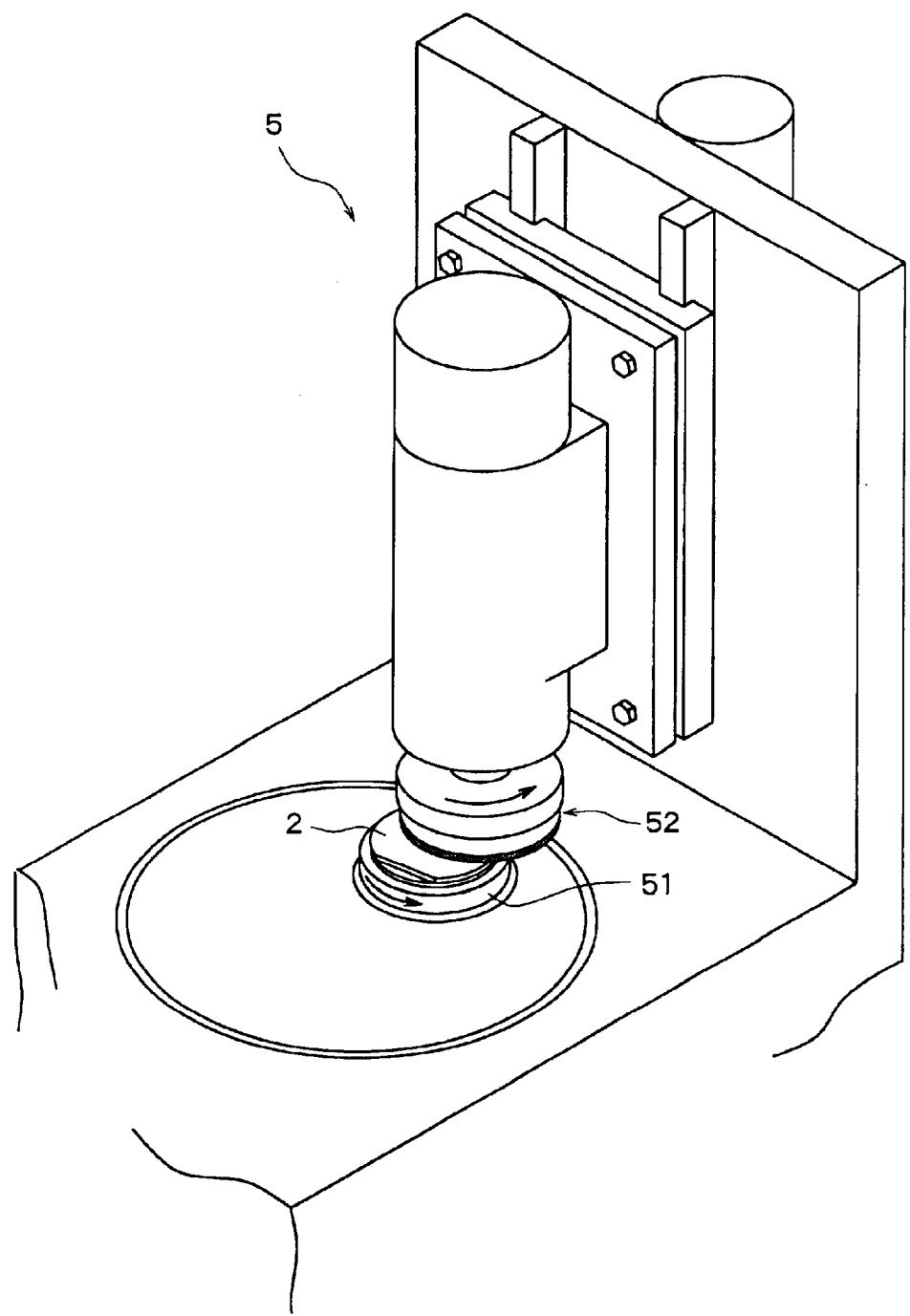

FIGS. 1(a) and (b) are explanatory diagrams showing a semiconductor wafer to be processed according to the present invention;

FIGS. 2(a) and (b) are explanatory diagrams showing the stress-reducing step of the processing method of the present invention;

FIGS. 3(a) and (b) are explanatory diagrams showing the step of affixing a protective tape to the front surface of a semiconductor wafer after the stress-reducing step shown in FIGS. 2(a) and (b); and FIG. 4 is an explanatory diagram showing the cutting step of the processing method of the present invention.

BEST MODE FOR CARRYING OUT THE INVENTION

The method of processing a semiconductor wafer according to an embodiment of the present invention will be described in detail hereinafter with reference to the accompanying drawings.

FIGS. 1(a) and (b) show a semiconductor wafer to be processed according to the present invention. FIG. 1(a) is a perspective view of the semiconductor wafer and FIG. 1(b) is a partially enlarged sectional view of the semiconductor wafer. The semiconductor wafer 2 shown in FIGS. 1(a) and (b) has a diameter of 200 mm and a thickness of 500 $\mu$m, and a circuit 22 is formed in each of a plurality of regions sectioned by a plurality of streets 21 on the front surface of the semiconductor wafer 2. A coating layer 23 as a protective film is formed on the front surface having the circuits 22. In the illustrated embodiment, the coating layer 23 is formed by applying a polyimide resin to the front surface of the semiconductor wafer 2 including the circuits 22 and baking it, and has a thickness of about 10 $\mu$m.

The back surface of the above-described semiconductor wafer 2 is ground to process it to a thickness of about 50 $\mu$m before it is divided into individual semiconductor chips by dicing along the plurality of streets 21. When the semiconductor wafer 2 is processed thin, it is warped by the influence of stress generated in the coating layer 23 as described above. In the present invention, therefore, to inhibit the occurrence of the above warping, the step of reducing stress that has generated in the above coating layer 23, for pulling toward the center direction is carried out before the back surface of the semiconductor wafer 2 is ground.

FIGS. 2(a) and (b) show the stress-reducing step of reducing the stress of the coating layer 23. FIG. 2(a) is a perspective view of the step and FIG. 2(b) is a partially enlarged sectional view of the semiconductor wafer 2. In the stress-reducing step, as shown in FIGS. 2(a) and (b), grooves 231 are formed in the coating layer formed on the front surface of the semiconductor wafer 2. A cutting machine that is generally used as a dicing machine can be used for forming the grooves 231. That is, the grooves 231 are formed in the coating layer 23 by holding the semiconductor wafer 2 on a chuck table 31 of the cutting machine and cut-feeding the chuck table 31 in a direction shown by an arrow X while a cutting blade 32 is rotated. It is desired that the grooves 231 be formed along the streets 21 in order not to damage the circuits 22. The depth of the grooves 231 is equivalent to the thickness of the coating layer 23 so that the coating layer 23 is desirably cut. The grooves 231 do not need to be always formed along all the streets, and are enough to be formed to such an extent that the stress of the coating layer 23 can be reduced and warping which occurs when the semiconductor wafer 2 is made as thin as about 50 μm can be suppressed. For example, four grooves 231 may be formed per each direction, though the grooves 231 may be formed along all the streets. As to cutting conditions for forming the grooves 231, it is appropriate that the revolution speed of the cutting blade 32 is about 20,000 rpm and the feed speed of the chuck table 31 is about 50 to 100 mm/sec.

After the stress-reducing step terminates, the semiconductor wafer 2 is turned upside down as shown in FIG. 3(a), and a protective sheet 4 for grinding is affixed on the front side (on the circuit 22-formed side), as shown in FIG. 3(b).

The grinding step for processing the back surface of the semiconductor wafer 2 having the protective sheet 4 affixed on the front surface as described above to a predetermined thickness is then carried out. That is, as shown in FIG. 4, the semiconductor wafer 2 is held on the chuck table 51 of the grinding machine 5 in such a manner that the back surface faces up, and a grinding wheel 52 is rotated at a revolution speed of 6,000 rpm while the chuck table 51 is rotated at a revolution speed of 300 rpm, and is brought into contact with the back surface of the semiconductor wafer 2 to grind the back surface of the semiconductor wafer 2. The semiconductor wafer 2 is ground until its thickness becomes about 50 μm. Even when the back surface of the semiconductor wafer 2 is ground until its thickness becomes about 50 μm, the occurrence of warping is inhibited because the stress of the coating layer 23 has been reduced by forming a plurality of grooves 231 in the coating layer 23 formed on the front surface of the semiconductor wafer 2 in the above stress-reducing step.

The semiconductor wafer 2 whose back surface has been processed to a thickness of about 50 μm as described above is conveyed to the subsequent dicing step where it is cut along the streets 21 by a dicing machine such as a cutting machine or the like and divided into individual semiconductor chips.

INDUSTRIAL UTILIZATION FEASIBILITY

In the method of processing a semiconductor wafer to a predetermined thickness according to the present invention, the stress-reducing step of reducing the stress of a coating layer by forming a plurality of grooves in the coating layer formed on the front surface of the semiconductor wafer is carried out before the back surface of the semiconductor wafer is ground. Therefore, even when the back surface of the semiconductor wafer is ground thin, the occurrence of warping is inhibited as the stress of the coating layer has been reduced. Therefore, the dicing work that is the subsequent step can be carried out smoothly.

What is claimed is:

1. A method of processing a semiconductor wafer that has circuits in a plurality of regions sectioned by a plurality of streets on the front surface and has a coating layer formed on the front surface having the circuits to a predetermined thickness, the method comprising:

a stress-reducing step of reducing the stress of the coating layer by forming a plurality of grooves in the coating layer formed on the front surface of the semiconductor wafer; and a grinding step of processing the back surface of the semiconductor wafer by grinding to a predetermined thickness after the stress-reducing-step.

2. The method of processing a semiconductor wafer according to claim 1, wherein the plural grooves to be formed in the coating layer in the stress-reducing step are formed along the plurality of streets.

3. The method of processing a semiconductor wafer according to claim 1, wherein the plural grooves to be formed in the coating layer in the above stress-reducing step are formed by cutting by moving the semiconductor wafer relatively to the cutting blade while the cutting blade is rotated.

* * * * *